(12) United States Patent
Inoue et al.

(10) Patent No.: US 8,022,787 B2
(45) Date of Patent: Sep. 20, 2011

(54) DUPLEXER, MODULE INCLUDING A DUPLEXER AND COMMUNICATION APPARATUS

(75) Inventors: Shogo Inoue, Kawasaki (JP); Jun Tsutsumi, Kawasaki (JP)

(73) Assignee: Taiyo Yuden Co., Ltd, Tokyo (JP)

( * ) Notice: Subject to any disclaimer, the term of this patent is extended or adjusted under 35 U.S.C. 154(b) by 0 days.

(21) Appl. No.: 12/712,142

(22) Filed: Feb. 24, 2010

(65) Prior Publication Data

US 2010/0148886 A1    Jun. 17, 2010

Related U.S. Application Data

(63) Continuation of application No. PCT/JP2007/074312, filed on Dec. 18, 2007.

(51) Int. Cl.
| | |
|---|---|
| H01P 5/12 | (2006.01) |
| H03H 7/46 | (2006.01) |
| H04B 1/52 | (2006.01) |
| H03H 9/70 | (2006.01) |
| H03H 9/72 | (2006.01) |

(52) U.S. Cl. ........ 333/110; 333/117; 333/129; 333/132; 333/133; 455/82

(58) Field of Classification Search .................. 333/109, 333/110, 112, 117, 118, 120, 121, 128, 129, 333/132, 133; 455/82
See application file for complete search history.

(56) References Cited

U.S. PATENT DOCUMENTS

| | | | |
|---|---|---|---|
| 5,446,464 A | 8/1995 | Feldle | |
| 6,748,197 B2 * | 6/2004 | Lindemann et al. | ............ 455/82 |
| 6,819,302 B2 * | 11/2004 | Volman | ......................... 343/895 |
| 7,277,403 B2 | 10/2007 | Frank | |
| 7,623,005 B2 * | 11/2009 | Johansson et al. | ............ 333/110 |
| 2003/0112768 A1 | 6/2003 | Frank | |
| 2004/0105490 A1 * | 6/2004 | Kubo et al. | ................... 375/219 |
| 2006/0189292 A1 | 8/2006 | Ueda et al. | |
| 2008/0032745 A1 * | 2/2008 | Kim et al. | .................. 455/562.1 |

FOREIGN PATENT DOCUMENTS

| | | |
|---|---|---|
| JP | 8-335841 A | 12/1996 |
| JP | 9-307600 A | 11/1997 |
| JP | 2003-209487 A | 7/2003 |
| JP | 2006-60747 A | 3/2006 |
| JP | 2006-222551 A | 8/2006 |
| KR | 10-2006-0079056 A | 7/2006 |
| WO | WO 2007/100169 | * 9/2007 |

OTHER PUBLICATIONS

Ramesh K. Gupta et al., "Quasi-Lumped-Element 3- and 4-Port Networks for MIC and MMIC Applications", IEEE MTT-S Digest, IEEE, 1984, pp. 409-411.
Korean Office Action dated Apr. 13, 2011, for Korean Application No. 10-2010-7003616, pp. 1-5 (including partial English translation).

* cited by examiner

*Primary Examiner* — Barbara Summons
(74) *Attorney, Agent, or Firm* — Arent Fox LLP

(57) ABSTRACT

A duplexer includes a common terminal, receiving filters, a transmitting filter, and a hybrid having four terminals (terminals 1 to 4). A first terminal (terminal 1), which is one of the four terminals of the hybrid is connected to the common terminal, the receiving filters are connected to a second terminal and a third terminal to which a signal is transmitted if it is input from the first terminal, and a transmitting filter is connected to a fourth terminal (terminal 4) of the hybrid. Thus, it is possible to improve the isolation of the duplexer, while avoiding an increase in the number of parts as well as greater complexity.

4 Claims, 16 Drawing Sheets

(b) +90°

DUPLEXER, MODULE INCLUDING A DUPLEXER AND COMMUNICATION APPARATUS

CROSS-REFERENCE TO RELATED APPLICATION

This application is based upon and claims the benefit of priority of the prior International Patent Application No. PCT/JP2007/074312, filed on Dec. 18, 2007, the entire contents of which are incorporated herein by reference.

FIELD

The present invention relates to a duplexer connected to an antenna of a communication device, as exemplified by a mobile phone, and to a module and a communication device including such a duplexer.

BACKGROUND

FIG. 18 is a diagram illustrating the configuration of a conventional duplexer. This conventional duplexer 81 includes a transmitting filter 82, which is connected between a common terminal Ant and a transmitting terminal Tx, a receiving filter 83, which is connected between the common terminal Ant and a receiving terminal Rx, and a matching circuit 84. When the duplexer 81 is used in a mobile phone for example, the common terminal Ant is connected to an antenna 94. The transmitting terminal Tx is connected to a transmitting circuit 93, and the receiving terminal Rx is connected via a balanced output filter 91 to a receiving circuit 92.

In FIG. 18, arrow Y1 denotes the flow of a transmission signal. Since the pass band of the transmitting filter 82 differs from the pass band of the receiving filter 83, when the transmission signal that is input into the transmitting terminal Tx passes the transmitting filter 82, as indicated by the arrow Y1, it does not flow to the receiving filter 83 but is output from the common terminal Ant to the antenna 94. Then, the transmission signal is radiated as an electromagnetic wave from the antenna 94.

Arrow Y2 denotes the flow of a reception signal. The reception signal received by the antenna 94 passes the matching circuit 84 and the receiving filter 83, as indicated by the arrow Y2, and is output from the receiving terminal Rx. The balanced output filter 91 converts the received signal into a differential signal (balanced-unbalanced conversion), and outputs it to the receiving circuit 92. This is the ideal signal flow within the duplexer.

However, in real duplexers, the entire transmission signal that is output from the transmitting filter 82 is not necessarily output from the common terminal Ant to the antenna, and a portion of it flows into the receiving filter 83 and reaches the receiving terminal Rx. Arrow Y3 indicates the flow of the transmission signal (transmit/receive leakage signal) that leaks in this manner to the receiving filter. Because of this transmit/receive leakage signal, there was the problem that the reception signal that is input from the receiving terminal Rx into the receiving circuit includes noise, and as a result, the receiving properties deteriorated.

Here, the transmit/receive isolation (referred to simply as "isolation" below) is used as a value that indicates the degree to which the transmit/receive leakage signal leaking from the transmission signal, which is input from the transmitting circuit to the transmitting terminal Tx, to the receiving filter 83 and reaching the receiving terminal Rx is suppressed.

With the duplexer 81 indicated in FIG. 18, the balanced filter 91, which is connected between the receiving terminal Rx and the receiving circuit 92 has the function of improving this isolation. As another example, a configuration has been disclosed (see for example Patent Document 1 listed below), where a shield electrode is provided in order to eliminate unnecessary electromagnetic coupling within the antenna branching filter, which is one of the causes of transmission signal leakage from the transmitting circuit to the receiving circuit.

Patent Document 1; Japanese Laid-Open Patent Publication No. 2006-60747

However, providing the above-noted balanced filter 91 or shield electrode leads to an increase in the number of parts, to higher costs and to greater complexity. Thus, with conventional duplexer configurations, it was difficult to improve the isolation while avoiding an increase in the number of parts, higher costs and greater complexity.

SUMMARY

A duplexer in accordance with the present invention includes a receiving filter or receiving filters that let(s) a reception signal in a receiving band pass; a transmission signal terminal into which a transmission signal in a transmitting band that is different from the receiving band can be input; a common terminal with which input of the reception signal in the receiving band and output of the transmission signal in the transmitting band can be performed; a hybrid that has a plurality of first terminals and a plurality of second terminals, and that divides (splits) a signal that is input from one of the first terminals with a phase difference and outputs the divided signals to the second terminals; wherein the common terminal and the transmission signal terminal are respectively connected to the first terminals; and wherein the receiving filter(s) is/are connected to the second terminals.

The object and advantages of the invention will be realized and attained by means of the elements and combinations particularly pointed out in the claims. It is to be understood that both the foregoing general description and the following detailed description are exemplary and explanatory and are not restrictive of the invention as claimed.

DESCRIPTION OF EMBODIMENT(S)

Figure 1:
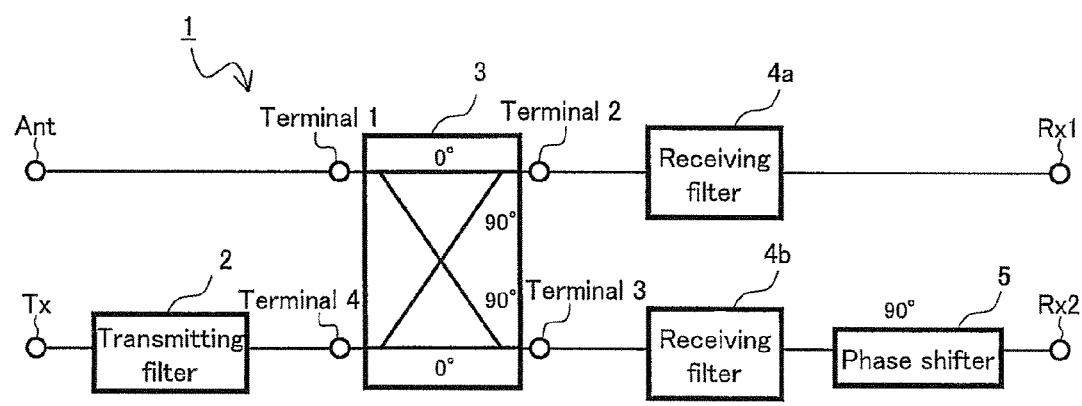
FIG. 1 is a drawing illustrating the overall configuration of a duplexer according to a first embodiment.

With configuration disclosed this application, transmission signals in a transmitting band that is input from the transmission signal terminal into one of the first terminals of the hybrid are respectively transmitted with a phase difference to the plurality of second terminals on the side of the receiving filter(s). And components that are different from the pass frequency band of the receiving filter(s) are reflected by the second terminals. In this situation, of the signals that are reflected by the second terminals, the phases of the signals that are transmitted to the first terminal to which the transmission signal terminal is connected become anti-phase and the signals cancel each other, whereas the phases of the signals that are transmitted to the first terminal to which the common terminal is connected becomes the same phase. Therefore, almost all of the signal that is input from the transmission signal terminal is output from the common terminal.

On the other hand, the signal in the receiving band that is input from the common terminal into the hybrid is output with a phase difference to the plurality of second terminals on the side of the receiving filter(s). Moreover, the transmission signal that is input from the transmission signal terminal and leaks to the receiving filter(s), that is, the transmit/receive leakage signal, is output with a phase difference to the plurality of second terminals on the side of the receiving filter(s). In this situation, due to the characteristics of the hybrid, the phase difference of the signals that are input from the common terminal and are output to the plurality of second terminals will have the opposite direction as the phase difference between the signals that are input from the transmission signal terminal and are output to the plurality of second terminals. Thus, regarding the phases of the signals that are output from the plurality of the second terminals, the phase shift of the reception signal from the common terminal will be different from that of the transmit/receive leakage signal from the transmission signal terminal. Therefore, it becomes possible to separate the reception signal from the common terminal and the transmit/receive leakage signal, and to improve the isolation properties.

With the invention disclosed in this application, the isolation of a duplexer can be improved while avoiding an increase in the number of parts and greater complexity.

In one embodiment of the present invention, the hybrid may output a signal that is input from one of the first terminals with a phase difference of 90° to the second terminals, and the duplexer may further include a phase shifter that shifts the phase of at least one of the reception signals that is input from the common terminal to the hybrid and is output with a phase difference of 90° from the second terminals, setting said phase difference to 180°.

Thus, the reception signals that are input from the common terminal and are respectively output from the plurality of second terminals are output from the second terminals as differential signals with a phase difference of 180° (anti-phase) due to the phase shifter. On the other hand, the transmit/receive leakage signals that are input from the transmission signal terminal and output from the plurality of second terminals have a phase that is shifted in a direction opposite to that of the reception signals, so that their phase difference is 0° (same phase) due to the phase shifter. Therefore, the differential amplitude due to the transmit/receive leakage signal that is output from the second terminals is extremely small. That is to say, the differential amplitude of the differential signal that is output from the second terminals includes hardly any components of the transmit/receive leakage signal and is mostly given by components of the reception signal. Therefore, it is possible to improve the isolation without adding any elements for the differential signal output, such as a balanced filter. Furthermore, it is possible to output a differential signal that has a higher resistance against noise than a single-ended signal.

A duplexer according to one embodiment of the present invention may further include a second hybrid having a plurality of first terminals and a plurality of second terminals, dividing (splitting) a signal that is input from one of the first terminals with a phase difference and outputting the divided signals to the second terminals; the second terminals of said hybrid and the first terminals of the second hybrid may be connected to each other via said receiving filter(s), and one of the remaining second terminals of the second hybrid is connected to a termination resistor; and the termination resistor may be connected to the second terminal of the second hybrid to which transmission signals that are input from the transmission signal terminal into one of the first terminals of said hybrid and are respectively output with a phase difference from the second terminals of said hybrid, pass through the receiving filter, and respectively enter the first terminals of the second hybrid are transmitted with the same phase.

With this configuration, the reception signals that are input from the common terminal into the hybrid and output from the plurality of second terminals with a phase difference are respectively input into the plurality of first terminals of the second hybrid via the receiving filter(s). Then, these reception signals reach one of the second terminals of the second hybrid at anti-phase and the other of the second terminals at the same phase. On the other hand, the transmit/receive leakage signals that are input from the transmission signal terminal into the hybrid and are output with a phase difference of 90° in the opposite direction to the reception signals from the other terminals are input via the receiving filter(s) into the second hybrid, and reach one of the second terminals of the second hybrid with the same phase and the other of the second terminals in anti-phase. Therefore, the transmit/receive leakage signal is output to that one of the second terminals of the second hybrid to which the termination resistor is connected, whereas the reception signal is output to the other of the second terminals. As a result, a reception signal that includes hardly any transmit/receive leakage signal is output from the other terminal of the second terminals of the second hybrid. Thus, the isolation properties are improved.

In one embodiment of the present invention, the hybrid may be constituted by an integrated passive device; and this integrated passive device, the receiving filter(s) and a transmitting filter may be mounted on the same substrate. It should be noted that a module or a communication device including the above-described duplexer is also included in the embodiments of the present invention.

First Embodiment

FIG. 1 is a drawing illustrating the overall configuration of a duplexer according to a first embodiment. This duplexer 1 includes a hybrid 3, a transmitting filter 2, receiving filters 4a and 4b and a phase shifter 5. In the duplexer 1, a terminal 1 of the hybrid 3 serves as a common terminal Ant. A transmitting filter 2 is connected between a terminal 4 of the hybrid 3 and a transmitting terminal (transmission signal terminal) Tx. The receiving filter 4a is connected between a terminal 2 of the hybrid 3 and a receiving terminal Rx1. The receiving filter 4b and the phase shifter 5 are connected between a terminal 3 of the hybrid 3 and a receiving terminal Rx2. The phase shifter 5 has the function of delaying the phase of a signal by 90°.

The pass frequency of the transmitting filter 2 and the pass frequency of the receiving filters 4a and 4b are set in accordance with the intended purpose of the duplexer 1, and these pass frequencies are different from each other. It should be noted that the pass frequency of the receiving filter 4a and the pass frequency of the receiving filter 4b are set to be substantially the same.

With this configuration, a reception signal that enters the hybrid 3 from the common terminal Ant through the terminal 1 is output with balanced output from the receiving terminal Rx1 and the receiving terminal Rx2 after passing through the receiving filters 4a and 4b. Moreover, the transmission signal that is input through the transmitting terminal Tx passes the transmitting filter 2, is input via the terminal 4 into the hybrid 3, and is output from the terminal 1 to the common terminal Ant. That is to say, the duplexer 1 is a balanced output duplexer in which the receiving terminal Rx1 and the receiving terminal Rx2 serve as balanced terminals.

The duplexer 1 can be used for example as a duplexer for a mobile communication device or a wireless communication device, as exemplified by a mobile phone. Such a mobile communication device or wireless communication device includes an antenna, a transmitting circuit that processes transmission signals that are sent from the antenna, and a receiving circuit that processes reception signals received with the antenna. The common terminal Ant of the duplexer 1 is connected to the antenna, the transmitting terminal Tx is connected to the transmitting circuit, and the receiving terminals Rx1 and Rx2 are connected to the receiving circuits.

The following is an explanation of the hybrid 3. In the present embodiment, a conventional 90° hybrid (also referred to as a 90° 3 dB hybrid coupler or 90° 3 dB coupler) is used as the hybrid 3. The hybrid 3 is a circuit element having four terminals, namely the terminals 1 to 4, and if these terminals 1 to 4 are set up as reflection-free terminations, then it has the property that a signal that is input from one of the terminals is equi-partitioned in power at two of the remaining three terminals and transmitted with a 90° phase difference. It should be noted that when the hybrid 3 is mounted, it is not necessarily required that the terminals 1 to 4 are always reflection-free terminations.

In the following, of the terminals 1 to 4, the terminal into which the signal is input is referred to as "input terminal", the two terminals from which this signal is output are referred to as "output terminal 1" and "output terminal 2", and the remaining terminal is referred to as "isolated terminal." That is to say, when a signal is input into the input terminal, signals with equi-partitioned power are output from the output terminal 1 and the output terminal 2. In this situation, the phase of the output signal from the output terminal 2 is delayed by 90° with respect to the phase of the output signal from the output terminal 1. Moreover, the signal that is input into the input terminal is hardly output at all from the isolated terminal.

The hybrid 3 has an electrically symmetric structure, so that taking any of the terminals 1 to 4 as the input terminal, two of the other terminals will function as the output terminals 1 and 2, and the last terminal will function as the isolated terminal. For example, if the terminal 1 is the input terminal, the terminals 2 and 3 will become the output terminals 1 and 2, and the terminal 4 will become the isolated terminal, whereas if the terminal 2 is the input terminal, the terminals 1 and 4 will become the output terminals 1 and 2, and the terminal 3 will become the isolated terminal.

If the common terminal Ant is taken as the input terminal of the hybrid 3, then the duplexer 1 in FIG. 1 can be said to have a configuration in which the transmitting filter 2 is connected to the isolated terminal, and the receiving filters 4a and 4b are connected to the output terminal 1 and the output terminal 2.

Figure 2A:
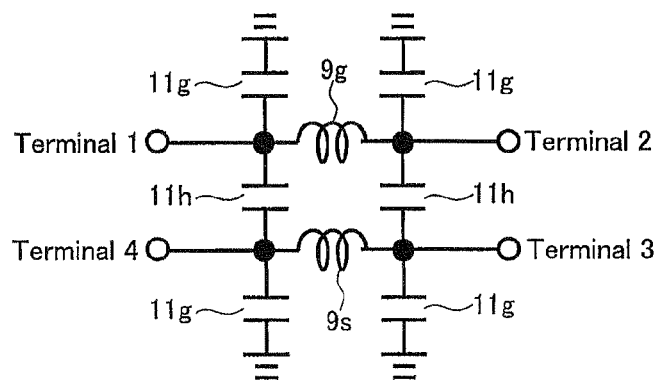
FIG. 2A is a diagram illustrating a circuit configuration example of a lumped parameter-type 90° hybrid.
Figure 2B:
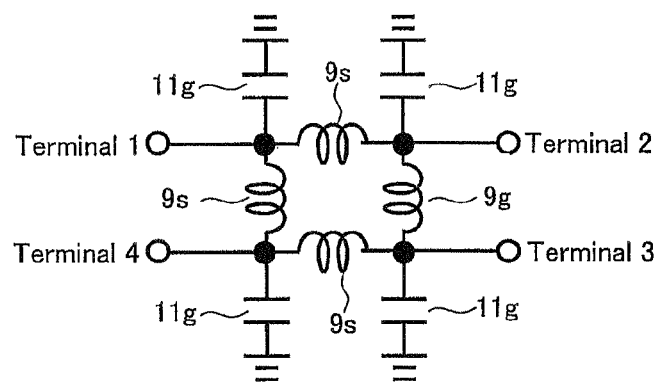
FIG. 2B is a diagram illustrating another circuit configuration example of a lumped parameter-type 90° hybrid.
Figure 2C:
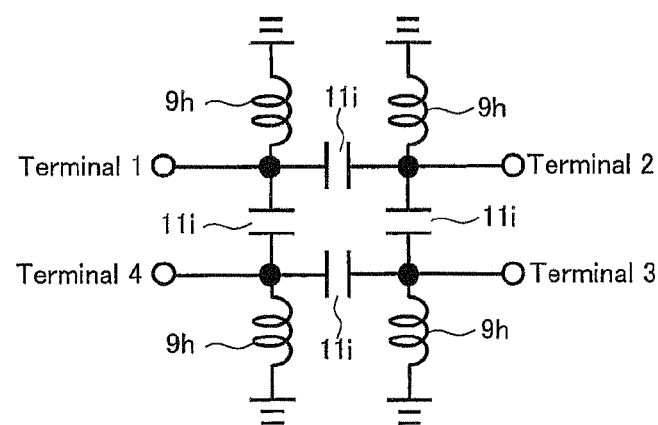
FIG. 2C is a diagram illustrating a further circuit configuration example of a lumped parameter-type 90° hybrid.

It is possible to use a distributed parameter-type branch-line coupler for the hybrid 3, but it is also possible to use a lumped parameter-type 90° hybrid made of inductors and capacitors. FIGS. 2A, 2B and 2C illustrate circuit configuration examples of lumped-type 90° hybrids.

In the example illustrated in FIG. 2A, a capacitor 11g whose one end is connected to ground is connected to each of the terminals 1 to 4. The terminals 1 and 2 as well as the terminals 3 and 4 are respectively connected by an inductor 9g, and the terminals 1 and 4 as well as the terminals 2 and 3 are respectively connected by a capacitor 11h. In the example illustrated in FIG. 2B, the terminals 1 and 2, the terminals 2 and 3, the terminals 3 and 4, and the terminals 1 and 4 are respectively connected to each other by inductors 9g. In the example illustrated in FIG. 2C, the terminals 1 and 2, the terminals 2 and 3, the terminals 3 and 4, and the terminals 1 and 4 are respectively connected by capacitors 11*i*. An inductor 9*h* whose one end is connected to ground is connected to each of the terminals 1 to 4. As illustrated in FIGS. 2A to 2C, the circuit configuration of a lumped parameter-type 90° hybrid is horizontally symmetric and vertically symmetric. It should be noted that the circuit configuration of the lumped parameter-type 90° hybrid is not limited to the examples illustrated in FIGS. 2A to 2C.

The hybrid used for the present invention is not limited to the above-noted examples. For example, it is possible to use a hybrid having at least four terminals, and having the function that, if those four terminals are reflection-free terminations, a signal that is input from one of those terminals is transmitted with a phase difference of 90° to two of the other terminals. For example, the number of terminals of the hybrid is not limited to four, as in the above examples. Also, there may be cases where it is not necessary that the phase difference when the signal that is input into the hybrid is output is exactly 90° without error margin in the actual circuit. As long as the below-described operation can be attained without problem, the phase difference may have a certain error margin. Also, as long as the below-described operation can be realized, the configuration of the hybrid is not limited to a configuration where the phase difference is 90° or a four-terminal circuit.

The foregoing is an explanation of the hybrid 3. For the other structural elements, namely the transmitting filter 2, the receiving filters 4*a* and 4*b*, and the phase shifter 5, it is possible to use conventional elements.

Figure 3:
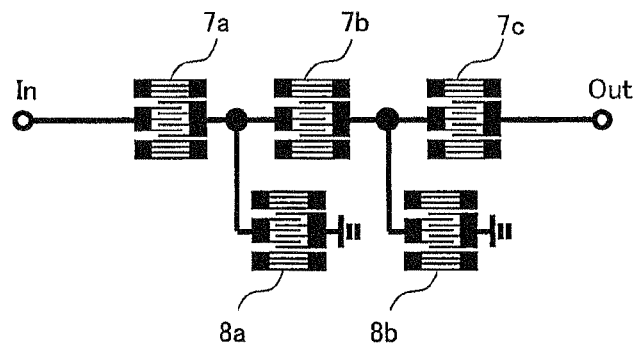
FIG. 3 is a diagram illustrating an example of the circuit configuration of a filter that can be used for the transmitting filter or the receiving filters.

FIG. 3 is a diagram illustrating an example of the circuit configuration of a filter that can be used for the transmitting filter 2 and the receiving filters 4*a* and 4*b*. The filter illustrated in FIG. 3 is a ladder-type filter constituted by series resonators 7*a*, 7*b* and 7*c* that are connected in series between an input terminal In and an output terminal Out, and parallel resonators 8*a* and 8*b* that are connected in parallel. As the series resonators 7*a*, 7*b* and 7*c* and the parallel resonators 8*a* and 8*b*, it is possible to use for example surface acoustic wave (SAW) resonators, boundary acoustic wave resonators, film bulk acoustic wave resonators (FBAR), solidly mounted resonators (SMR) or ceramic filters. In the example illustrated in FIG. 3, 1-port SAW resonators are used.

Figure 4A:
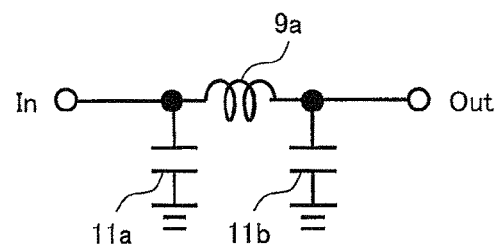
FIG. 4A is a diagram illustrating a circuit configuration example of a phase shifter.
Figure 4B:
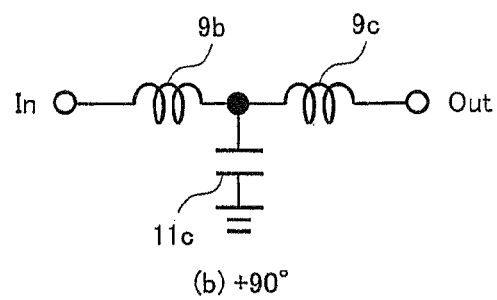
FIG. 4B is a diagram illustrating another circuit configuration example of a phase shifter.

FIGS. 4A, 4B, 4C and 4D illustrate examples of the circuit configuration of the phase shifter 5. The phase shifter illustrated in FIG. 4A is constituted by an inductor 9*a* that is connected in series between an input terminal In and an output terminal Out, and two capacitors 11*a* and 11*b* that are connected in parallel. The phase shifter illustrated in FIG. 4B is constituted by two inductors 9*b* and 9*c* that are connected in series between an input terminal In and an output terminal Out, and a capacitor 11*c* that is connected in parallel. The shifting circuits illustrated in FIGS. 4A and 4B can be used as phase-delaying phase shifters that delay the phase of a signal that is input from the input terminal In by 90° and output it from the output terminal Out, for example.

Figure 4C:
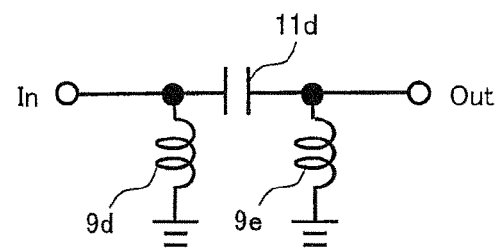
FIG. 4C is a diagram illustrating a further circuit configuration example of a phase shifter.
Figure 4D:
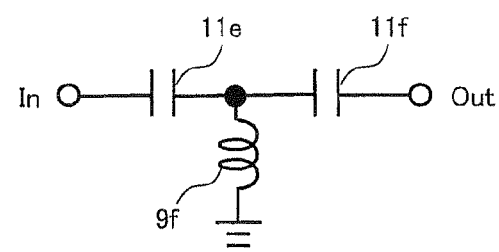
FIG. 4D is a diagram illustrating a further circuit configuration example of a phase shifter.

The phase shifter illustrated in FIG. 4C is constituted by a capacitor 11*d* that is connected in series between an input terminal In and an output terminal Out, and two inductors 9*d* and 9*e* that are connected in parallel. The phase shifter illustrated in FIG. 4D is constituted by two capacitors 11*e* and 11*f* that are connected in series between an input terminal In and an output terminal Out, and an inductor 9*f* that is connected in parallel. The phase shifters illustrated in FIGS. 4C and 4D can be used as phase-advancing phase shifters that advance the phase of a signal that is input from the input terminal In by 90° and output it from the output terminal Out, for example.

It should be noted that the specific configuration of the phase shifter is not limited to FIGS. 4A to 4D, and may also be another, conventional phase shifter configuration. Moreover, the phase shifters illustrated in FIGS. 4A to 4D may be constituted by a combination of lumped parameter-type elements, such as coils or capacitors with distributed parameter-type elements, such as strip wirings or microstrip wirings. Furthermore, the phase shifters illustrated in FIGS. 4A to 4D may be constituted by chip capacitors and chip coils, and they may also be constituted by integrated passive devices (IPDs).

Figure 5A:
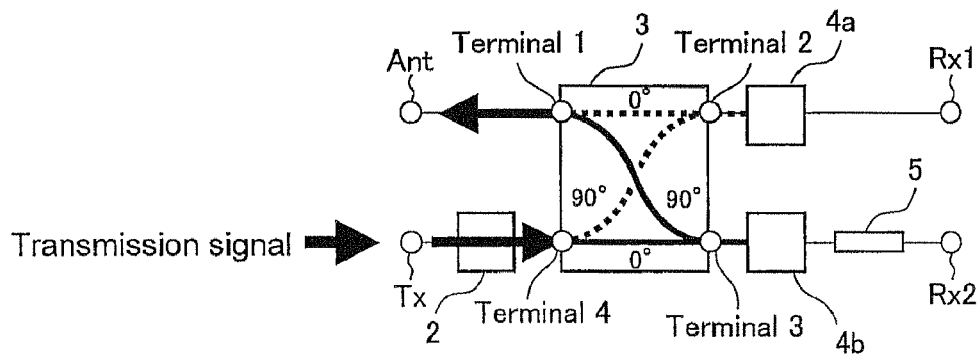
FIG. 5A is a diagram schematically illustrating the flow of a transmission signal in the duplexer.
Figure 5B:
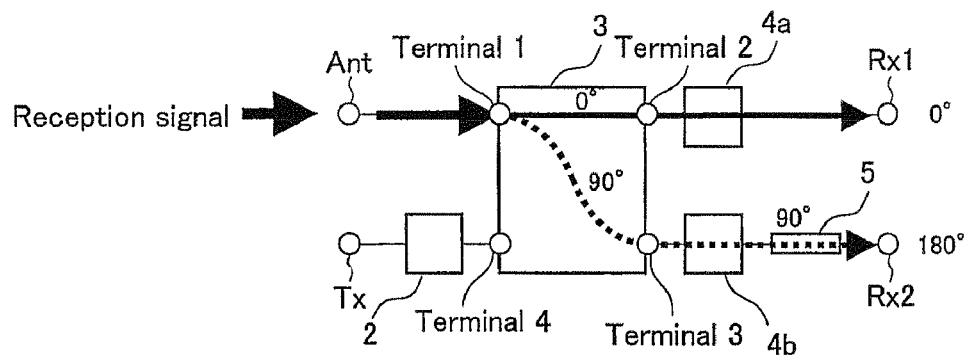
FIG. 5B is a diagram schematically illustrating the flow of a reception signal in the duplexer.
Figure 5C:
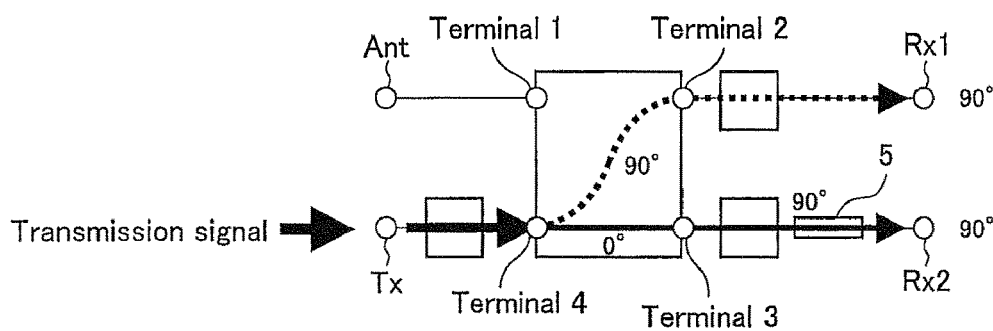
FIG. 5C is a diagram schematically illustrating the flow of a transmit/receive leakage signal in the duplexer.

Referring to FIGS. 5A to 5C, the following is an explanation of the operation of the duplexer 1. FIG. 5A is a diagram schematically illustrating the flow of a transmission signal in the duplexer. A transmission signal with a transmitting frequency that is input from the transmitting circuit (not illustrated) into the transmitting terminal Tx passes the transmitting filter 2 and is input into the terminal 4 of the hybrid 3. The transmitting signal that is input from the terminal 4 is equi-partitioned in power, is output from the terminals 2 and 3, and reaches the receiving filters 4*a* and 4*b*. Here, due to the phase characteristics of the hybrid 3, the phase of the signal that is input from the terminal 4 and output from the terminal 2 (the dotted path in the drawing) is delayed by 90° with respect to the phase of the signal that is output from the terminal 3 (the solid-line path in the drawing).

The frequency of the signals that are output from the terminal 2 and the terminal 3 is the transmitting frequency, and since it is not the pass frequency of the receiving filters 4*a* and 4*b*, the signals are reflected almost completely by the entrance ports of the receiving filters 4*a* and 4*b* (that is, at the terminal 2 and terminal 3). The reflected two signals enter the hybrid 3 again from these terminals 2 and 3, and are equi-partitioned in power to the terminal 1 and the terminal 4. In this situation, the phase of the signal reaching the terminal 4 from the terminal 2 is delayed by 90° with respect to the signal reaching the terminal 1 from the terminal 2. Similarly, the phase of the signal reaching the terminal 1 from the terminal 3 is delayed by 90° with respect to the signal reaching the terminal 4 from the terminal 3.

Looking at the reflected signal reaching the terminal 1, the signal following the path terminal 4→terminal 2→terminal 1 (dotted path) has a phase difference of 0° (same phase) with respect to the signal following the path terminal 4→terminal 3→terminal 1 (solid-line path). On the other hand, looking at the reflected signal reaching the terminal 4, the signal following the path terminal 4→terminal 3→terminal 4 (solid-line path) has a phase difference of 180° (anti-phase) with respect to the signal following the path terminal 4→terminal 2→terminal 4 (dotted path), so that these signals cancel each outer out. Consequently, the signals reflected by the terminal 2 and the terminal 3 are not output from the terminal 4, but are output from the terminal 1. That is to say, almost all of the energy of the transmission signal that is reflected by the terminals 2 and 3 is output to the terminal 4. Thus, almost the entire transmission signal of the transmitting frequency that is input into the transmitting terminal Tx is output from the terminal Ant to the antenna (not illustrated in the drawing).

FIG. 5B is a diagram schematically illustrating the flow of a reception signal in the duplexer 1. A reception signal with a receiving frequency that is input into the common terminal Ant is input from the terminal 1 into the hybrid 3. The input reception signal is equi-partitioned in power, and is output from the terminals 2 and 3. Here, due to the phase characteristics of the hybrid 3, the phase of the signal that is input from the terminal 1 and output from the terminal 3 (the dotted path in the drawing) is delayed by 90° with respect to the phase of the signal that is input from the terminal 1 and output from the terminal 2 (the solid-line path in the drawing). The signals of the receiving frequency that are output from the terminal 2 and the terminal 3 of the hybrid 3 pass through the receiving filters 4a and 4b, respectively.

The signal that passes through the receiving filter 4a reaches the receiving terminal Rx1. On the other hand, the phase of the signal that passes through the receiving filter 4b is delayed by 90° by the phase shifter 5, and reaches the receiving terminal Rx2. Consequently, of the reception signals that are input from the common terminal Ant, the phase of the reception signal that reaches the receiving terminal Rx2 after passing through terminal 1→terminal 3→receiving filter 4b→phase shifter 5 (dotted path) is delayed by 180° with respect to the phase of the reception signal that reaches the receiving terminal Rx1 after passing through terminal 1→terminal 2→receiving filter 4a (solid-line path). Therefore, the reception signal that is input from the common terminal Ant is equi-partitioned in power, and corresponding signals are output from the receiving terminal Rx1 and the receiving terminal Rx2 with a phase difference of 180° (in anti-phase). That is to say, the reception signal that is input into the common terminal Ant is output from the receive terminals Rx1 and Rx2 as a differential (balanced) signal. In this situation, the waveform of the reception signal is represented as a differential amplitude of the differential signal.

FIG. 5C is a diagram schematically illustrating the flow of a transmit/receive leakage signal. A transmission signal that is input into the transmitting terminal Tx is input from the terminal 4 into the hybrid 3, is equi-partitioned in power by the hybrid 3, and corresponding signals reach the terminal 2 and the terminal 3, respectively. Here, due to the phase characteristics of the hybrid 3, the phase of the signal that is input from the terminal 4 and reaches the terminal 2 (the dotted path in the drawing) is delayed by 90° with respect to the phase of the signal that is input from the terminal 4 and reaches the terminal 3 (the solid-line path in the drawing).

Here, there are components of the signal reaching the terminals 2 and 3 of the hybrid 3 that pass through the receiving filters 4a and 4b, that is, there are transmit/receive leakage signals. Since a phase shifter 5 that delays the phase by 90° is inserted at the output side of the receiving filter 4b, the phase of the signal passing through the receiving filter 4b is delayed 90°. Consequently, the transmit/receive leakage signal that is input from the transmitting terminal Tx and reaches the receiving terminal Rx1 has the same phase as the transmit/receive leakage signal reaching the receiving terminal Rx2. Therefore, the differential amplitude due to the component of the transmit/receive leakage signal that is output from the receiving terminal Rx1 and the receiving terminal Rx2 becomes extremely small.

Due to this operation, the reception signal that is input into the common terminal Ant is output from the receive terminal Rx1 and the receive terminal Rx2 with a phase difference of 180° (anti-phase). On the other hand, the transmit/receive leakage signal that is input into the transmitting terminal Tx and leaks to the receiving filters 4a and 4b is output from the receiving terminal Rx1 and the receiving terminal Rx2 with a phase difference of 0° (the same phase). Therefore, the transmit/receive leakage signal is canceled and only the components of the reception signal appear in the differential signal that is output from the receive terminal Rx1 and the receive terminal Rx2. As a result, the isolation is improved significantly, and a superior isolation is realized.

Figure 6A:
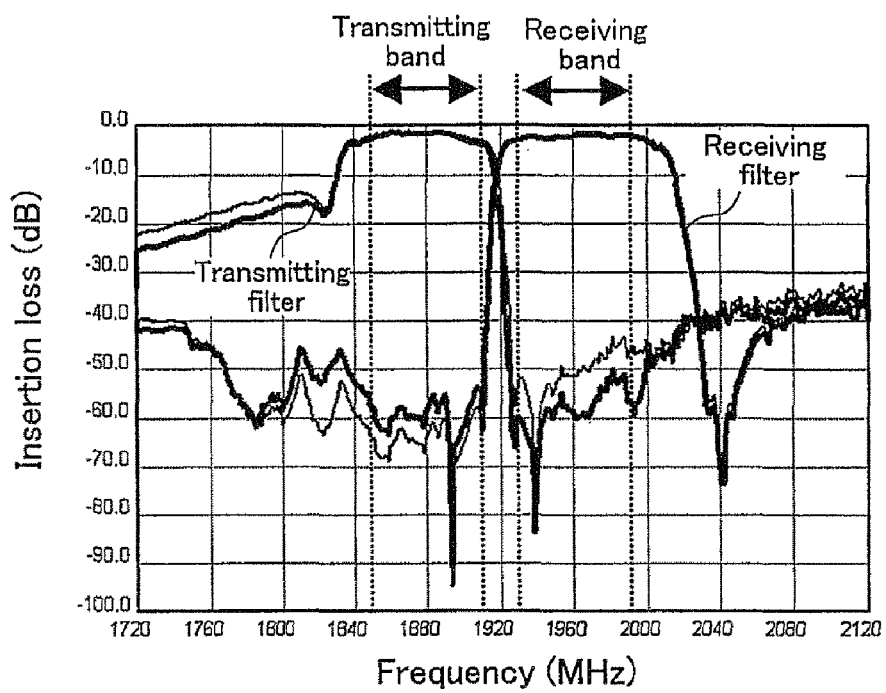
FIG. 6A is a graph illustrating the frequency characteristics of the transmitting filter and the receiving filters of the duplexer.
Figure 6B:
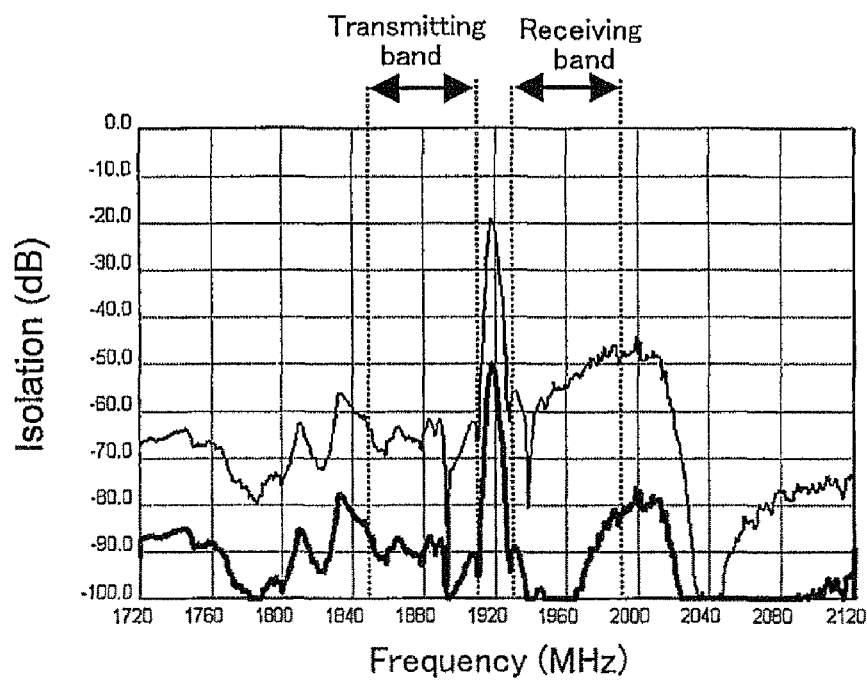
FIG. 6B is a graph illustrating the isolation characteristics of the duplexer.
Figure 18:
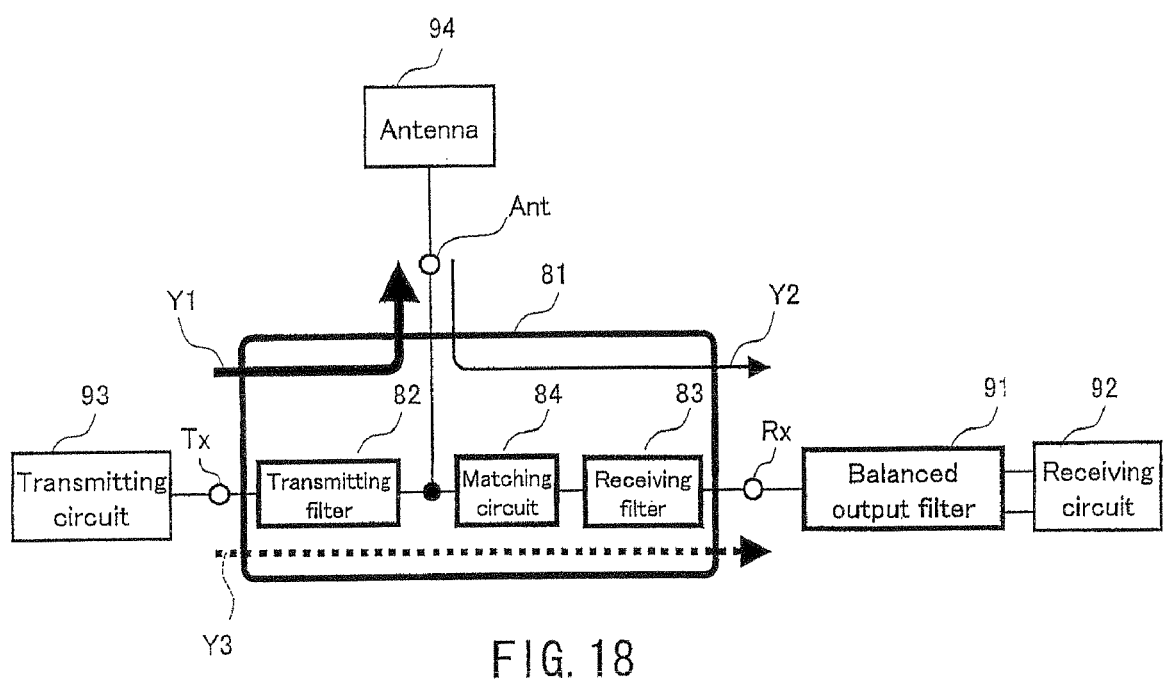
FIG. 18 is a diagram illustrating the configuration of a conventional duplexer.

FIGS. 6A and 6B are graphs that illustrate the result of a simulation of the characteristics of the duplexer 1 illustrated in FIG. 1. In the graphs of FIGS. 6A and 6B, the bold lines represent the characteristics of the duplexer 1 according to the present embodiment, and the thin lines represent the simulated characteristics of a duplexer 81 as illustrated in FIG. 18. FIG. 6A is a graph illustrating the frequency characteristics of the transmitting filter 2 and the receiving filters 4a and 4b of the duplexer 1. The vertical axis of these graphs marks the insertion loss (in dB), and the horizontal axis marks the frequency (in MHz). In the graph in FIG. 6A, the transmitting filter 2 and the receiving filters 4a and 4b of the duplexer 1 exhibit substantially the same characteristics as in the conventional duplexer 81.

FIG. 6B is a graph illustrating the isolation characteristics of the duplexer 1. The vertical axis in this graph marks the insertion loss (in dB) and the horizontal axis marks the frequency (in MHz). From the graph in FIG. 6B, it can be seen that the isolation of the duplexer 1 in the transmitting band and the receiving band is improved by 20 dB to 30 dB compared to the conventional duplexer 81. That is to say, it can be seen that the duplexer 1 can realize a superior isolation of at least 80 dB.

Thus, with the present embodiment, the isolation can be improved considerably without adding parts such as a balanced output filter. That is to say, with the duplexer 81 illustrated in FIG. 18, the isolation level between the transmitting terminal Tx and the receiving terminal Rx is at a level of about 50 dB in the transmitting/receiving bands. An isolation level of 50 dB does not reach the required level, so that it was necessary to add a balanced output filter 91 having an attenuation of about 20 dB at the receiving terminal Rx of the duplexer. By contrast, the duplexer 1 in FIG. 1 improves the isolation level to the required level, so that it is not necessary to add a separate part.

Moreover, the duplexer 1 can output the reception signal as a differential output (balanced) signal, even without adding parts for balancing the output, such as a balanced output filter or the like. Conventionally, it was difficult to balance the output with an FBAR filter in principle, but with the duplexer 1 of the present embodiment, it is possible to realize a balanced output duplexer using an FBAR, with a configuration using an FBAR for the transmitting filter 2 or the receiving filters 4a and 4b.

Figure 7:
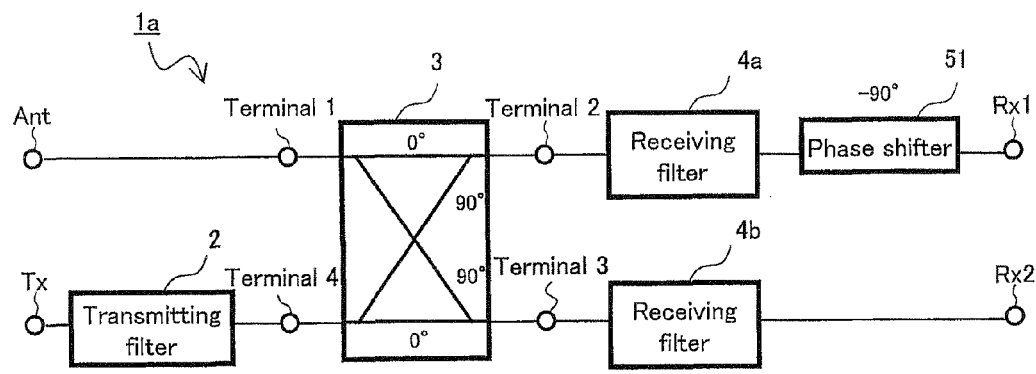
FIG. 7 is a graph illustrating a modification example of the configuration of the duplexer in a first embodiment.

It should be noted that the configuration for displaying the above-noted effects is not limited to the configuration of the duplexer 1 illustrated in FIG. 1. FIG. 7 is a diagram illustrating a modified example of a configuration of a duplexer according to the present embodiment. This duplexer 1a includes a phase-advancing phase shifter 51 that advances the phase angle by 90° between the receiving filter 4a and the receiving terminal Rx1. That is to say, the phase shifter 51 that advances the phase angle of the output reception signal by 90° is provided on the side of the output terminal Rx1 of the receiving filter 4a that is connected to that terminal of the output terminals in the hybrid 3 from which the reception signal is output (terminal 2 and terminal 3), where the phase of the output receiving signal is advanced by 90°.

Also in this case, the reception signal that is input from the common terminal Ant is output from the receiving terminal Rx1 and the receiving terminal Rx2 with a phase difference of 180°, and the transmit/receive leakage signal flowing from the filter 2 to the receiving filters 4a and 4b is output with the same phase (with a phase difference of) 0° from the receiving terminal Rx1 and the receiving terminal Rx2, respectively. Therefore, also the duplexer 1a with the configuration illustrated in FIG. 7 can attain the same effect as the duplexer 1 illustrated in FIG. 1.

Second Embodiment

Figure 8:
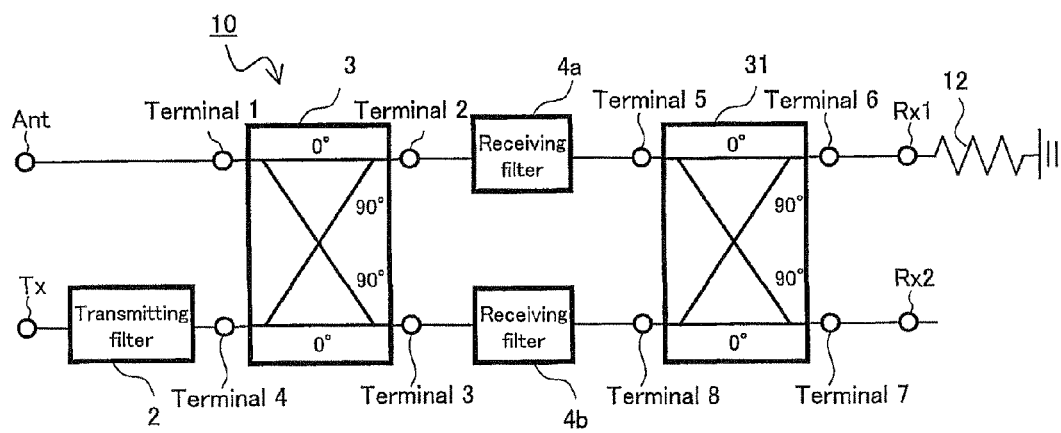
FIG. 8 is a graph illustrating a circuit configuration of a duplexer according to a second embodiment.

FIG. 8 is a diagram illustrating the circuit configuration of a duplexer 10 according to a second embodiment. In FIG. 8, elements that are the same as in FIG. 1 are denoted by the same reference signs. In the duplexer 10 illustrated in FIG. 8, another hybrid 31 is connected on the side of the receiving terminals of the receiving filter 4a and the receiving filter 4b. The hybrid 31 is a 90° hybrid having the same functionality as the hybrid 3, and includes a terminal 5, a terminal 6, a terminal 7 and a terminal 8. The terminal 5 is connected to the receiving filter 4a and the terminal 8 is connected to the receiving filter 4b. The terminal 6 is connected to the receiving terminal Rx1 and the terminal 7 is connected to the receiving terminal Rx2.

A termination resistor 12 is connected to the receiving terminal Rx1, which is connected to the terminal 6 of the hybrid 31. Thus, the receiving terminal Rx1 serves as a reflection-free termination. Therefore, the receiving terminal Rx2 serves as a single-ended output terminal. With this configuration, a single-ended duplexer is realized.

Figure 9A:
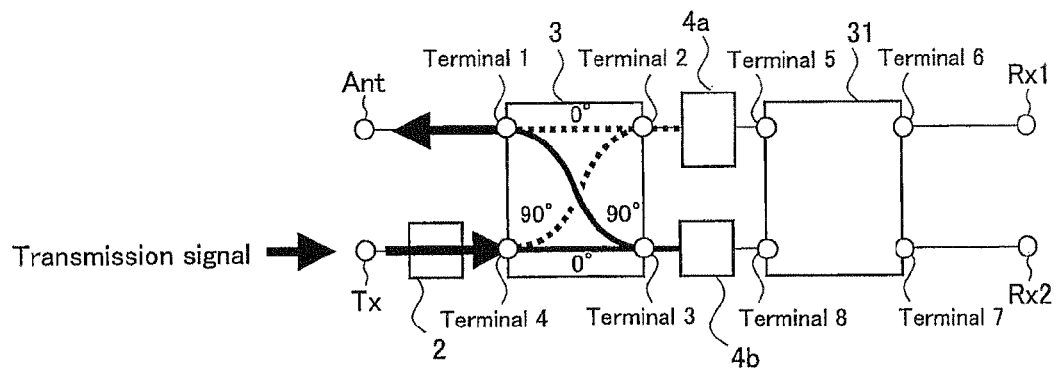
FIG. 9A is a diagram schematically illustrating the flow of the transmission signal in the duplexer.
Figure 9B:
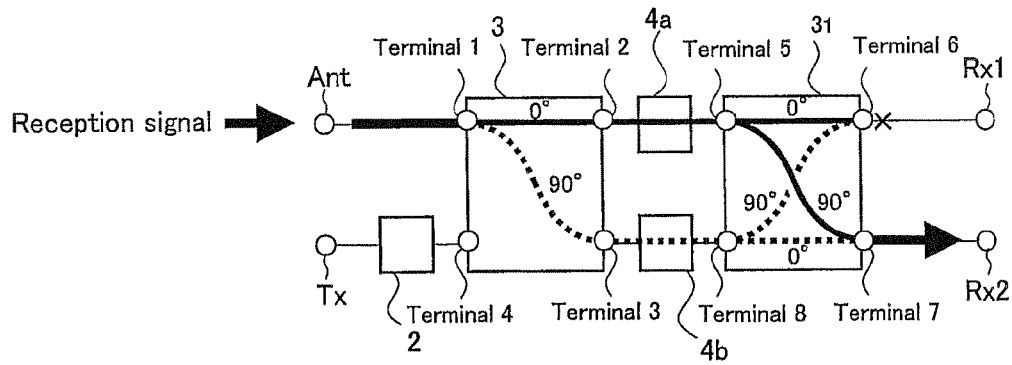
FIG. 9B is a diagram schematically illustrating the flow of the reception signal in the duplexer.
Figure 9C:
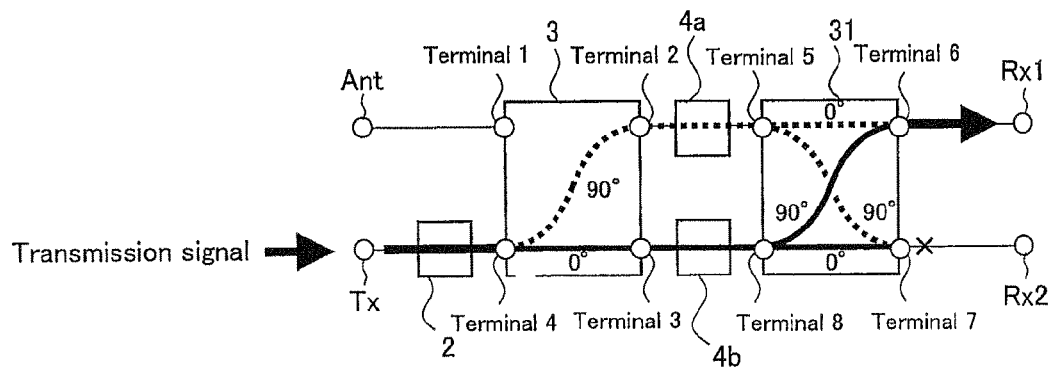
FIG. 9C is a diagram schematically illustrating the flow of the transmit/receive leakage signal in the duplexer.

The following is an explanation of the operation of the duplexer 10, referring to FIGS. 9A to 9C. FIG. 9A is a diagram that schematically illustrates the flow of the transmission signal in the duplexer 10. The flow of the transmission signal illustrated in FIG. 9A is the same as the flow of the transmission signal illustrated in FIG. 5A. Almost all of the transmission signal of the transmitting frequency that is input from the terminal 4 is reflected at the terminal 2 and the terminal 3, and is output from the terminal 1. Therefore, almost all of the transmission signal with the transmitting frequency that is input at the transmitting terminal Tx is output from the common terminal Ant to the antenna (not illustrated in the drawings).

FIG. 9B is a diagram that schematically illustrates the flow of the reception signal in the duplexer 10. The reception signal with the receiving frequency that is input at the common terminal Ant is input from the terminal 1 to the hybrid 3. The reception signal that has been input is equi-partitioned in power and is output from the terminal 2 and the terminal 3. Here, the phase of the signal that is input from the terminal 1 and output from the terminal 3 (dotted path in the drawing) is delayed by 90° with respect to the phase of the signal that is output from the terminal 2 (solid-line path in the drawing).

The reception signal that is output from the terminal 2 and the terminal 3 of the hybrid 3 passes through the receiving filters 4a and 4b, and is input from the terminal 5 and the terminal 8 to the hybrid 31. The reception signal that is input at the terminal 5 is equi-partitioned in power and reaches the terminal 6 and the terminal 7. In this situation, the phase of the reception signal at the terminal 7 is delayed by 90° with respect to the phase of the reception signal at the terminal 6. The reception signal that is input at the terminal 8 is equi-partitioned in power and reaches the terminal 6 and the terminal 7. In this situation, the phase of the reception signal at the terminal 6 is delayed by 90° with respect to the phase of the reception signal at the terminal 7.

Here, looking at the reception signals reaching the terminal 6 in total, the reception signal following the path terminal 1→terminal 2→receiving filter 4a→terminal 5→terminal 6 (solid-line path) to the terminal 6 is in anti-phase (phase difference of 180°) with respect to the reception signal following the path terminal 1→terminal 3→receiving filter 4b→terminal 8→terminal 6 (dotted path) to the terminal 6. Therefore, the reception signals reaching the terminal 6 cancel each other out.

On the other hand, looking at the reception signals reaching the terminal 7 in total, the reception signal following the path terminal 1→terminal 2→receiving filter 4a→terminal 5→terminal 7 (solid-line path) to the terminal 7 has the same phase (phase difference of 0°) as the reception signal following the path terminal 1→terminal 3→receiving filter 4b→terminal 8→terminal 7 (dotted path) to the terminal 7. These reception signals reaching the terminal 6 thus reinforce each other. Therefore, almost all of the energy of the receiving signals with the receiving frequency that is input from the common terminal Ant is transmitted to the terminal 7.

FIG. 9C is a diagram schematically illustrating the flow of the transmit/receive leakage signals. The transmission signal that is input at the transmitting terminal Tx is equi-partitioned in power by the hybrid 3 and the equi-partitioned signals reach the terminal 2 and the terminal 3, respectively. Here, the phase of the signal that reaches the terminal 2 (dotted path in the drawing) is delayed by 90° with respect to the phase of the signal that reaches the terminal 3 (solid-line path in the drawing).

Here, there are components of the transmission signal reaching the terminals 2 and 3 of the hybrid 3 that pass through the receiving filters 4a and 4b, that is, there are transmit/receive leakage signals. The transmit/receive leakage signal that passes through the receiving filter 4a is input from the terminal 5 into the hybrid 31 and is equi-partitioned in power at the terminal 6 and the terminal 7. In this situation, the phase of the transmit/receive leakage signal at the terminal 7 is delayed by 90° with respect to the phase of the transmit/receive leakage signal at the terminal 6. The transmit/receive leakage signal that passes through the receiving filter 4b is input from the terminal 8 into the hybrid 31 and is equi-partitioned in power at the terminal 6 and the terminal 7. In this situation, the phase of the transmit/receive leakage signal at the terminal 6 is delayed by 90° with respect to the phase of the transmit/receive leakage signal at the terminal 7.

Here, looking at the transmit/receive leakage signals reaching the terminal 6 in total, the signal following the path terminal 4→terminal 3→receiving filter 4b→terminal 8→terminal 6 (solid-line path) to the terminal 6 has the same phase (phase difference of 0°) as the signal following the path terminal 4→terminal 2→receiving filter 4a→terminal 5→terminal 6 (dotted path) to the terminal 6, so that the signals reinforce each other.

On the other hand, looking at the transmit/receive leakage signals reaching the terminal 7 in total, the signal following the path terminal 4→terminal 3→receiving filter 4b→terminal 8→terminal 7 (solid-line path) to the terminal 7 is in anti-phase (phase difference of)180° with respect to the signal following the path terminal 4→terminal 2→receiving filter 4a→terminal 5→terminal 7 (dotted path) to the terminal 7. Therefore, the transmit/receive leakage signals reaching terminal 6 cancel each other.

Therefore, almost all of the energy of the transmit/receive leakage signal that is input from the transmitting terminal Tx is transmitted to the terminal 6. The energy of the transmit/receive leakage signal transmitted to the terminal 6 is dissipated by the termination resistor 12. That is to say, the transmit/receive leakage signal reaching the terminal 6 is not reflected at the terminal 6, but flows into the termination resistor 12, so that it does not enter the hybrid 31 again.

Through this operation, the reception signal that is input into the common terminal Ant is output from the receive terminal Rx2. On the other hand, the transmit/receive leakage signal that is input from the transmitting terminal Tx and leaks to the receiving filters 4a and 4b is absorbed to the receiving terminal Rx1, which is a reflection-free termination. That is to say, a receiving signal that does not include a transmit/receive leakage signal is output from the receiving terminal Rx2, which is a single-ended output terminal, and it becomes possible to improve the isolation considerably.

Figure 10A:
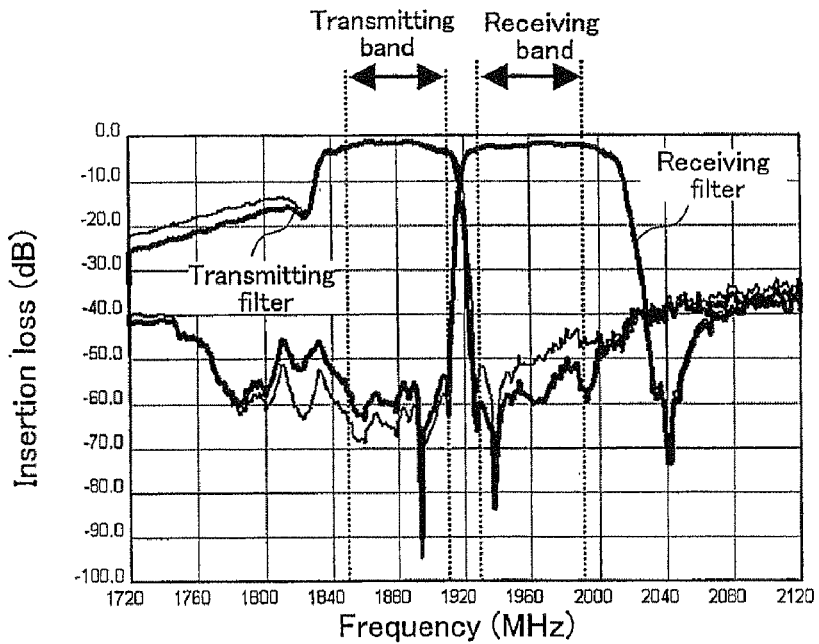
FIG. 10A is a graph illustrating the frequency characteristics of the transmitting filter and the receiving filters of the duplexer.
Figure 10B:
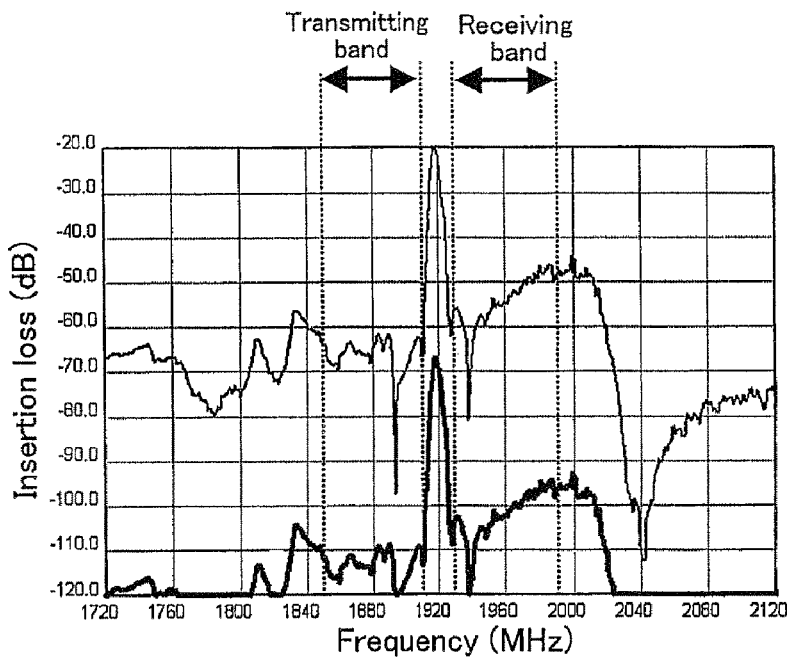
FIG. 10B is a graph illustrating the isolation characteristics of the duplexer.

FIGS. 10A and 10B are graphs that illustrate the result of a simulation of the characteristics of the duplexer 10 illustrated in FIG. 8. In the graphs of FIGS. 10A and 10B, the bold lines represent the characteristics of the duplexer 10 according to the present embodiment, and the thin lines represent the simulated characteristics of a duplexer 81 as illustrated in FIG. 18. FIG. 10A is a graph illustrating the frequency characteristics of the transmitting filter 2 and the receiving filters 4a and 4b of the duplexer 10. The vertical axis of these graphs marks the insertion loss (in dB), and the horizontal axis marks the frequency (in MHz). In the graph in FIG. 10A, the transmitting filter 2 and the receiving filters 4a and 4b of the duplexer 10 exhibit substantially the same characteristics as in the conventional duplexer 81.

FIG. 10B is a graph illustrating the isolation characteristics of the duplexer 10. The vertical axis in this graph marks the insertion loss (in dB) and the horizontal axis marks the frequency (in MHz). From the graph in FIG. 10B, it can be seen that the isolation of the duplexer 10 in the transmitting band and the receiving band is improved by about 40 dB compared to the conventional duplexer 81. That is to say, it can be seen that the duplexer 10 can realize a superior isolation of at least 90 dB. With the present embodiment, it is possible to improve the isolation considerably without adding parts, such as a balanced output filter.

Moreover, the duplexer 10 of the present embodiment is a single-ended duplexer improving the isolation considerably. Therefore, it is possible to realize a balanced output duplexer with sufficiently improved isolation by connecting a balanced-unbalanced converter (balun) at the receiving terminal Rx2 of the duplexer 10. Thus, compared to the case of a balanced output duplexer using a balanced output filter as illustrated in FIG. 18, the device can be made smaller and the costs can be reduced.

Now, in the configuration of the duplexers 1 and 10 illustrated in FIG. 1 and FIG. 8, two single-ended filters (receiving filters 4a and 4b) are used as the receiving filters. However, the configuration of the receiving filters is not limited to this, and it is also possible to use one balanced filter 4c, as illustrated in FIG. 11A and FIG. 11B for example, as the receiving filter.

Figure 11A:
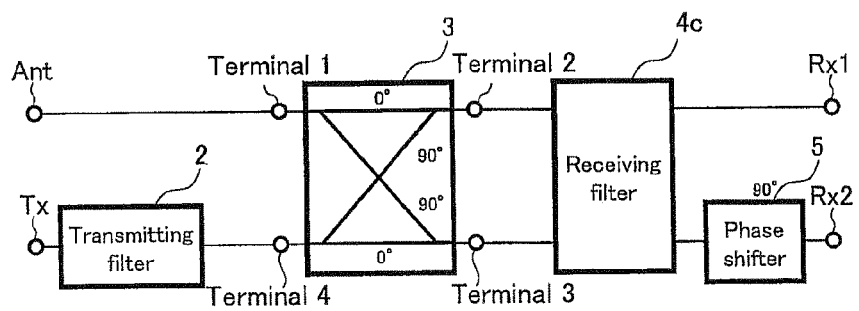
FIG. 11A is a diagram illustrating a configuration, in which the two receiving filters 4a and 4b of the duplexer illustrated in FIG. 1 are replaced by a balanced filter 4c.
Figure 11B:
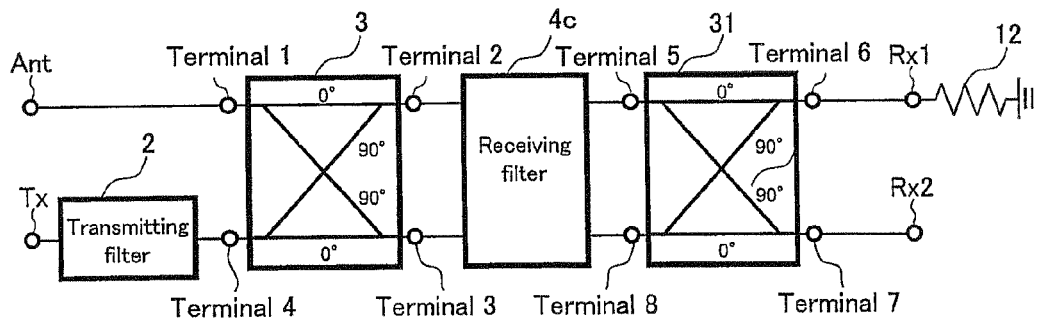
FIG. 11B is a diagram illustrating a configuration, in which the two receiving filters 4a and 4b of the duplexer illustrated in FIG. 8 are replaced by a balanced filter 4c.

FIG. 11A is a diagram illustrating a configuration, in which the two single-ended filters (receiving filters 4a and 4b) of the duplexer 1 in FIG. 1 are replaced by a balanced filter 4c. FIG. 11B is a diagram illustrating a configuration, in which the two single-ended filters (receiving filters 4a and 4b) of the duplexer 10 illustrated in FIG. 8 are replaced by a balanced filter 4c. Also in the configurations illustrated in FIG. 11A and FIG. 11B, the same effect of improving the isolation is attained as in the case of using two single-ended filters as the receiving filters.

For the balanced filter 4c, it is possible to use a double-mode surface acoustic wave filter (SAW filter) or boundary acoustic wave filter, or a ladder-type or lattice-type surface acoustic wave filter, boundary acoustic wave filter or FBAR filter.

Figure 11C:
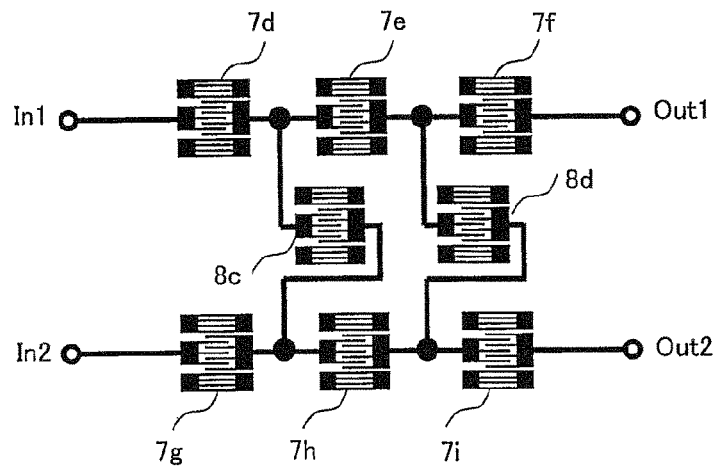
FIG. 11C is a circuit diagram of a balanced filter that is constituted by a ladder-type SAW filter.

FIG. 11C is a circuit diagram of a balanced filter 4c that is constituted by a ladder-type SAW filter. In the balanced filter 4c illustrated in FIG. 11C, series resonators 7d, 7e and 7f are connected in series between an input terminal In1 and an output terminal Out1. Moreover, series resonators 7g, 7h and 7i are connected in series between an input terminal Int and an output terminal Out2. Parallel resonators 8c and 8d are connected in parallel to the wiring between the input terminal In1 and the output terminal Out1 and the wiring between the input terminal In2 and the output terminal Out2. As series resonators 7d to 7i and parallel resonators 8c and 8d, it is possible to use, for example, 1-port SAW resonators. It should be noted that the circuit configuration of the balanced filter 4c is not limited to the circuit configuration illustrated in FIG. 11C.

The two hybrids used in the present invention are not limited to the hybrids 3 and 31 of the present embodiment. That is to say, it is possible to use as the hybrid (the first hybrid and the second hybrid) any circuit having at least four terminals and having the functionality of transmitting a signal that is input from any one of the terminals to at least two of the other terminals with a phase a difference of 90°. The common terminal is connected to the first terminal of the first hybrid, the transmission signal terminal is connected to the fourth terminal, and two of the terminals of the second hybrid are connected to the second terminal and the third terminal respectively via receiving filters. Moreover, a termination resistor is connected to at least one of the remaining terminals of the hybrid. The termination resistor is connected to that terminal where the transmitting signal that is input at the fourth terminal of the first hybrid from the transmission signal terminal is transmitted through the receiving filter and the second hybrid at the same phase. With this configuration, the isolation can be improved considerably, as noted above. It should be noted that the circuit configuration of the hybrids is not limited to a configuration with four terminals or a configuration having a phase difference of 90°, as long as the above-described operation can be attained.

DUPLEXER MOUNTING EXAMPLES

The following is an explanation of a mounting example of the duplexer according to the first embodiment. It should be noted that the following mounting example is merely an illustrative example, and embodiments of the duplexer are not limited to this mounting example.

Mounting Example 1

Figure 12:
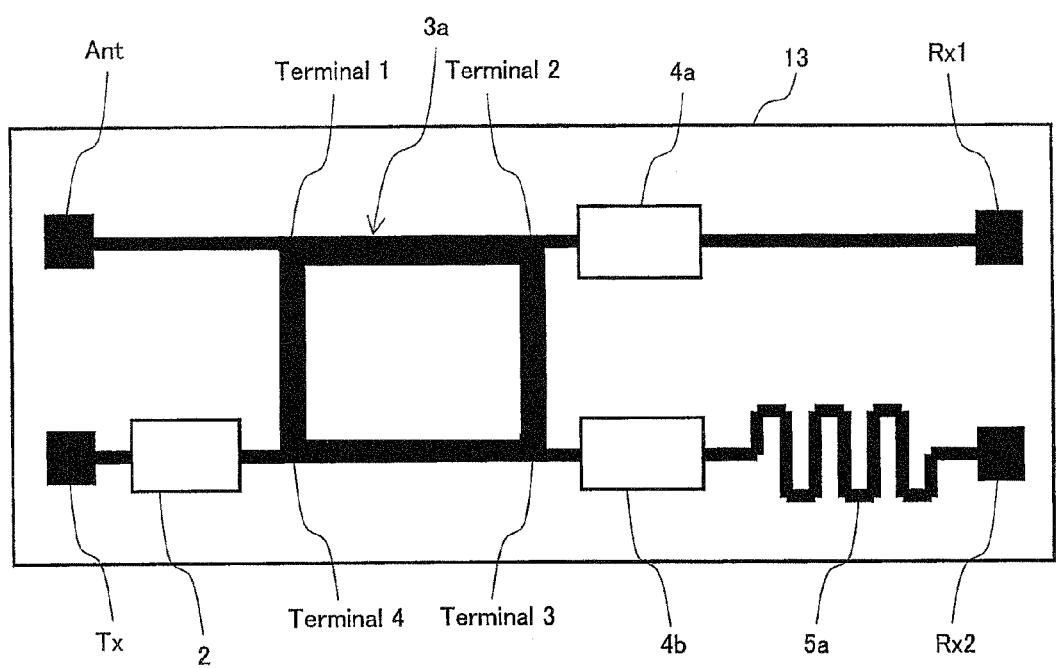
FIG. 12 is a diagram illustrating the structure of a case where the duplexer is mounted on a ceramic substrate.

FIG. 12 is a diagram illustrating the structure of a case where the duplexer 1 illustrated in FIG. 1 is mounted on a ceramic substrate. In the example illustrated in FIG. 12, the hybrid 3a and the phase shifter 5a are formed as distributed parameter-type elements on a ceramic substrate 13.

More specifically, the hybrid 3a is a branch-line coupler that is formed by distributed parameter-type wirings that respectively connect the terminals 1 and 2, the terminals 2 and 3, the terminals 3 and 4, and the terminals 1 and 4 on the ceramic substrate 13. It should be noted that the configuration of the branch-line coupler is not limited to that in FIG. 12. For example, in order to save space, the distributed parameter-type wirings that connect the terminals 1 to 4 may also be of bent form. Moreover, in order to widen the frequency band that can be used, there may also be distributed parameter-type wirings added to the configuration. The distributed parameter-type wirings may also be formed in an inner layer of the ceramic substrate.

The phase shifter 5a is formed by a microstrip line that meanders in snake-like fashion on the ceramic substrate 13. Boundary acoustic wave filters are used for the transmitting filter 2 and the receiving filters 4a and 4b, for example. These boundary acoustic wave filters are mounted by flip-chip bonding on the ceramic substrate 13.

Mounting Example 2

Figure 13:
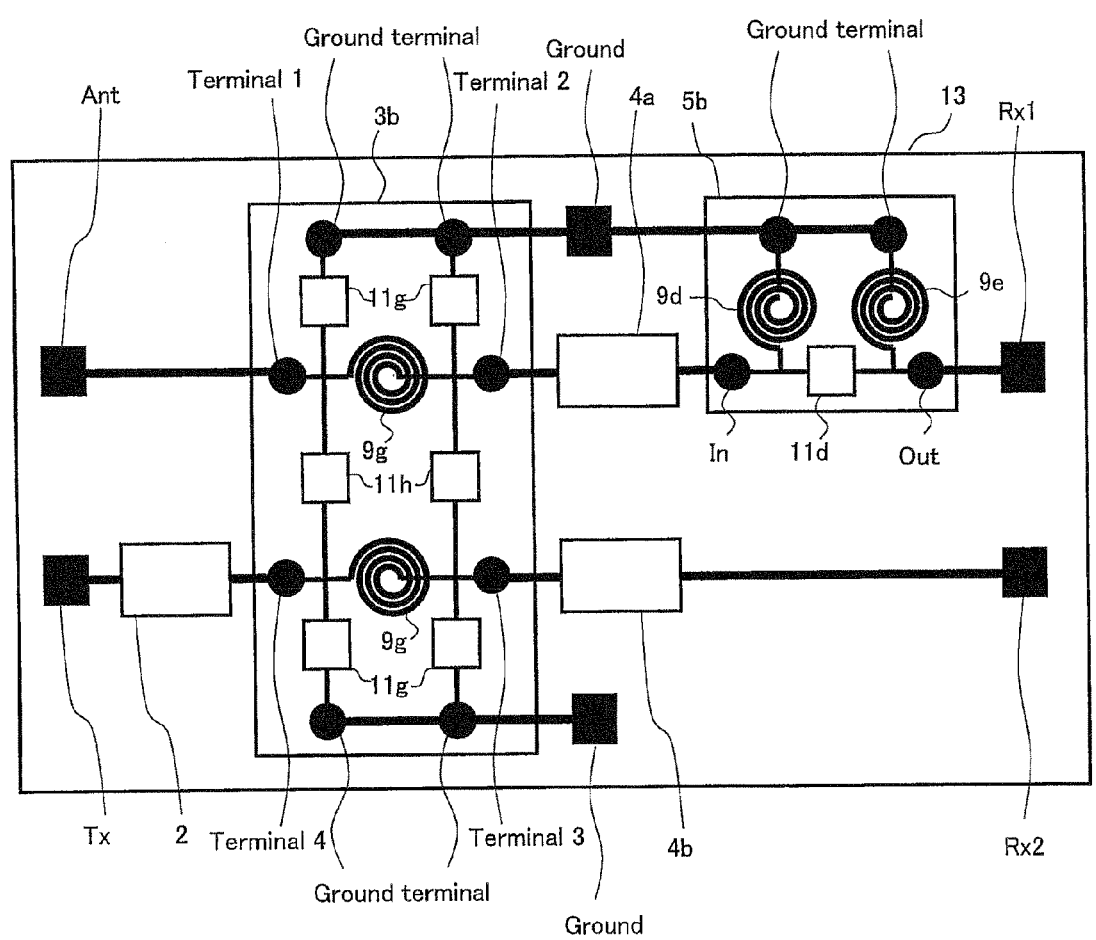
FIG. 13 is a diagram illustrating another structure of a case where the duplexer is mounted on a ceramic substrate.

FIG. 13 is a diagram illustrating the structure of a case where the duplexer 1a illustrated in FIG. 7 is mounted on the ceramic substrate 13. The hybrid 3b and the phase shifter 5b illustrated in FIG. 13 are configured using lumped parameter-type elements (are of the lumped parameter type). More specifically, the hybrid 3b and the phase shifter 5b are realized as IPDs (integrated passive devices) formed on the surface of the ceramic substrate 13.

Two inductor chips 9g respectively connected between the terminals 1 and 2 and between the terminals 3 and 4, two capacitor chips 11h respectively connected between the terminals 1 and 4 and between the terminals 2 and 3, and four capacitors 11g respectively connected between the terminals 1, 2, 3, 4 and ground terminals are integrated in the IPD of the hybrid 3b. The circuit configuration of this hybrid 3b corresponds to the circuit configuration illustrated in FIG. 2A.

A capacitor 11d that is arranged in the wiring between the input terminal In and the output terminal Out, and inductors 9d and 9e that are connected between this wiring and ground terminals are integrated in the IPD of the phase shifter 5b. The circuit configuration of the phase shifter 5b corresponds to the circuit configuration illustrated in FIG. 4C.

These IPDs are mounted on the ceramic substrate 13 by flip-chip bonding. The transmitting filter 2 and the receiving filters 4a and 4b are formed by boundary acoustic wave filters, and are mounted on the ceramic substrate 13. Thus, the duplexer 1a can be mounted on one ceramic substrate by forming the IPD-type hybrid 3b on the surface of the ceramic substrate 13, which is an isolating substrate, and forming the transmitting filter 2, the receiving filters 4a and 4b and the phase shifter 5b on the same ceramic substrate 13. Thus, the duplexer 1a becomes a compact module. Moreover, the duplexer 1a can be mounted in one package.

Mounting Example 3

Figure 14:
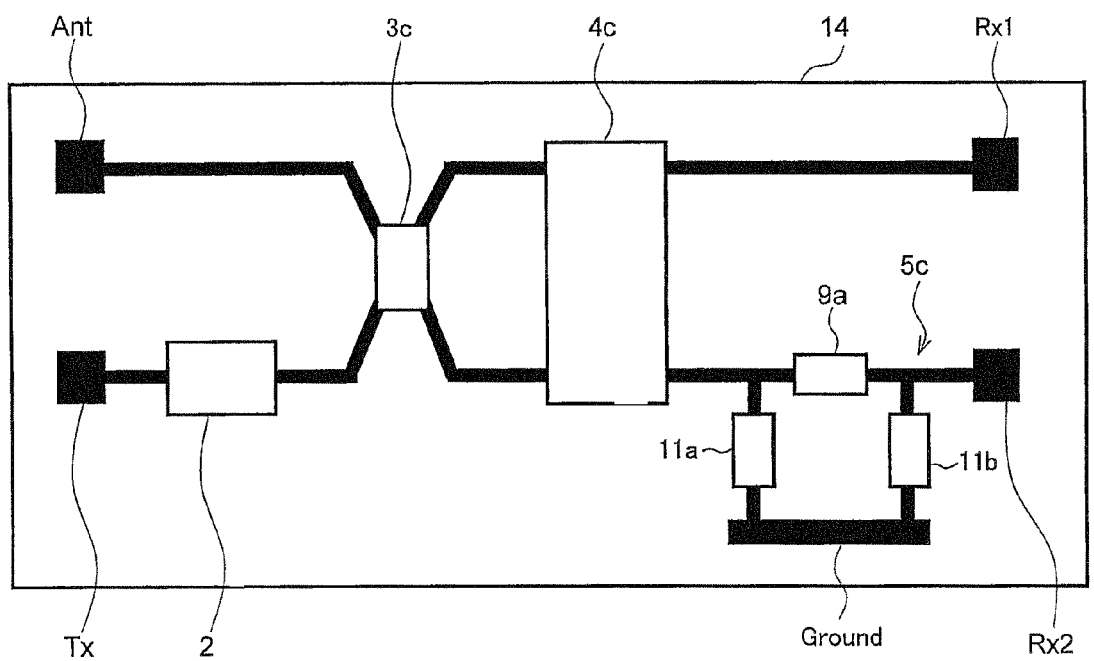
FIG. 14 is a diagram illustrating a structure of a case where the duplexer is mounted on a printed circuit board.

FIG. 14 is a diagram illustrating the structure of a case where the duplexer illustrated in FIG. 11A is mounted on a printed circuit board 14. In the example illustrated in FIG. 14, the hybrid 3c and the phase shifter 5c are each constituted by chip components. The hybrid 3c is constituted by a chip-type laminated hybrid coupler, for example. This laminated hybrid coupler is mounted by soldering it onto the printed circuit board 14. A commercially available product may be used for the laminated hybrid coupler.

The phase shifter 5c is formed by an inductor chip 9a that is arranged in the wiring between the balanced filter 4c and the receiving terminal Rx2, and capacitor chips 11a and 11b that are connected between this wiring and ground. The inductor chip 9a and the capacitor chips 11a and 11b are mounted by soldering onto the printed circuit board 14. The circuit configuration of the phase shifter 5c corresponds to the circuit configuration illustrated in FIG. 4A.

The transmitting filter 2 and the balanced filter 4c are formed, for example, by boundary acoustic wave filters, and are mounted on the printed circuit board 14 by flip-chip bonding. Thus, it is possible to mount the duplexer onto one printed circuit board 14.

Mounting Example 4

Figure 15:
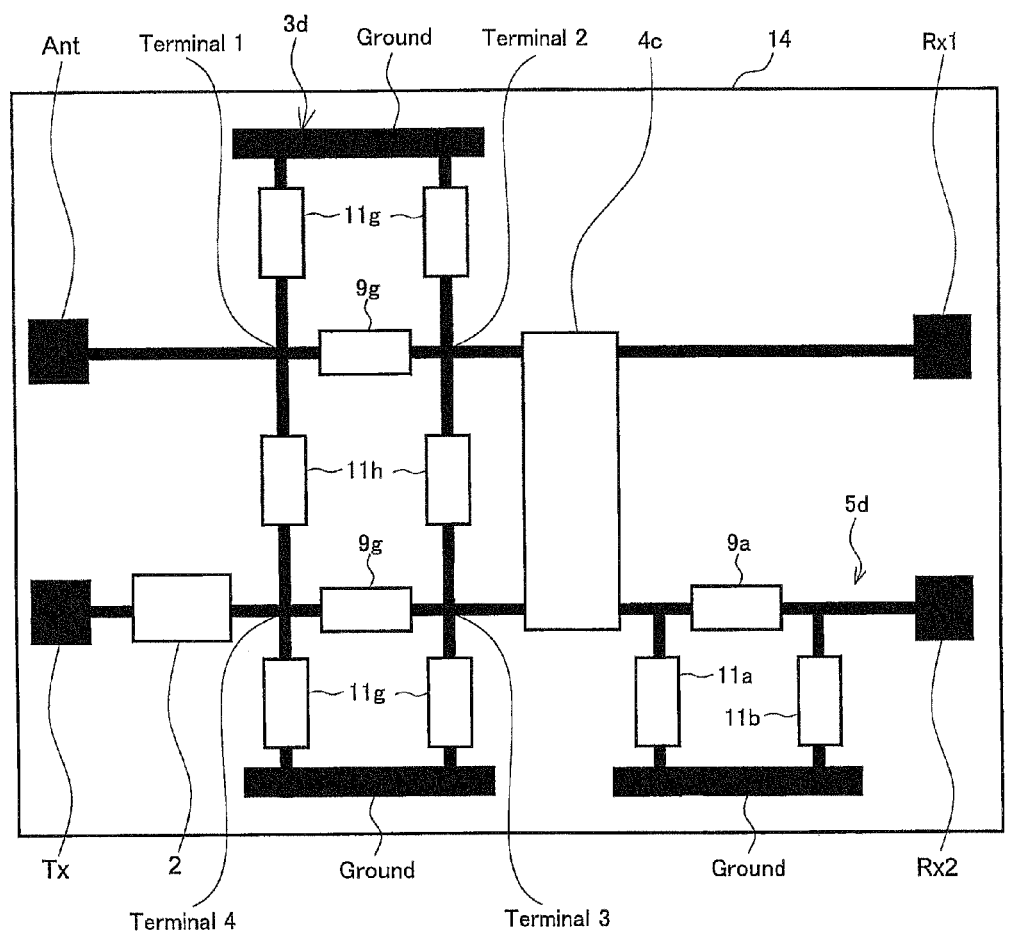
FIG. 15 is a diagram illustrating another structure of a case where the duplexer is mounted on a printed circuit board.

FIG. 15 is a diagram illustrating the structure of a case where the duplexer illustrated in FIG. 11A is mounted on a printed circuit board 14. In the example illustrated in FIG. 15, a hybrid 3d is formed by chip-type lumped parameter-type elements. That is to say, the hybrid 3d includes inductor chips 9g and 9b that are respectively connected between the terminals 1 and 2 and between the terminals 3 and 4, capacitor chips 11h that are respectively connected between the terminals 1 and 4 and between the terminals 2 and 3, and four capacitors 11g that are respectively connected between the terminals 1, 2, 3, 4 and ground. The circuit configuration of this hybrid 3d corresponds to the circuit configuration illustrated in FIG. 2A. The phase shifter 5d, the transmitting filter 2 and the balanced filter 4c are the same as in the mounting example illustrated in FIG. 14.

Mounting Example 5

Figure 16:
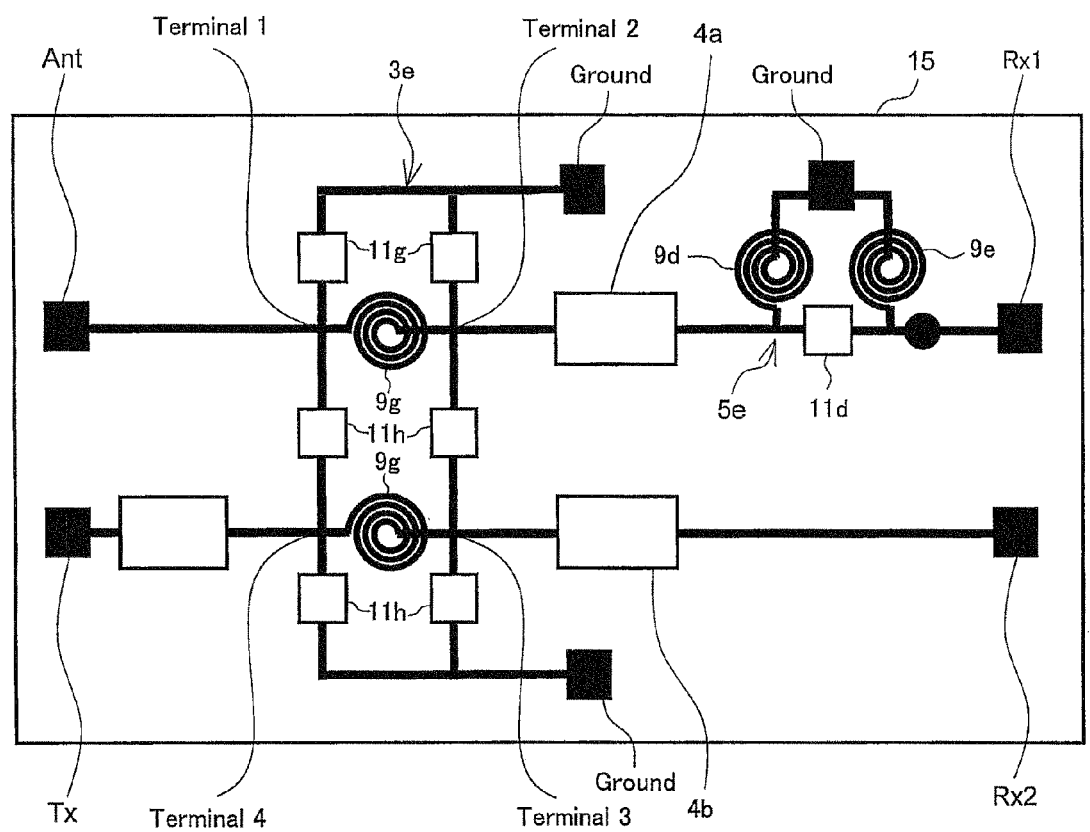
FIG. 16 is a diagram illustrating a structure of a case where the duplexer is mounted on a piezoelectric substrate.

FIG. 16 is a diagram illustrating the structure of a case where the duplexer 1a illustrated in FIG. 7 is mounted on a piezoelectric substrate 15. In the example illustrated in FIG. 16, the transmitting filter 2 and the receiving filters 4a and 4b are realized by boundary acoustic wave filters that are formed on the piezoelectric substrate 15. Moreover, a hybrid 3e and a phase shifter 5e are formed by arranging lumped parameter-type elements on the piezoelectric substrate 15. More specifically, the hybrid 3e is formed by inductors 9g of the IPD type and capacitors 11g and 11h of the IPD type. The circuit configuration of the hybrid 3e corresponds to the circuit configuration illustrated in FIG. 4A. Also the phase shifter 5e is formed by inductors 9d and 9e and a capacitor 11d of the IPD type. The circuit configuration of the phase shifter 5e corresponds to the circuit configuration illustrated in FIG. 4C. With this configuration, it is possible to realized a balanced output duplexer having superior isolation characteristics on a single chip.

As illustrated by the above mounting examples, a duplexer with superior isolation characteristics can be realized with a simple structure. Therefore, a balanced output duplexer is obtained that attains the required isolation while avoiding an increase in the number of parts, an increase in costs or an increase in complexity. It should be noted that there is no limitation to the balanced output type, and it is also possible to mount a single-ended duplexer as illustrated in FIG. 8 in the same manner as in the above-described mounting examples.

Communication Device Including the Duplexer

Figure 17:
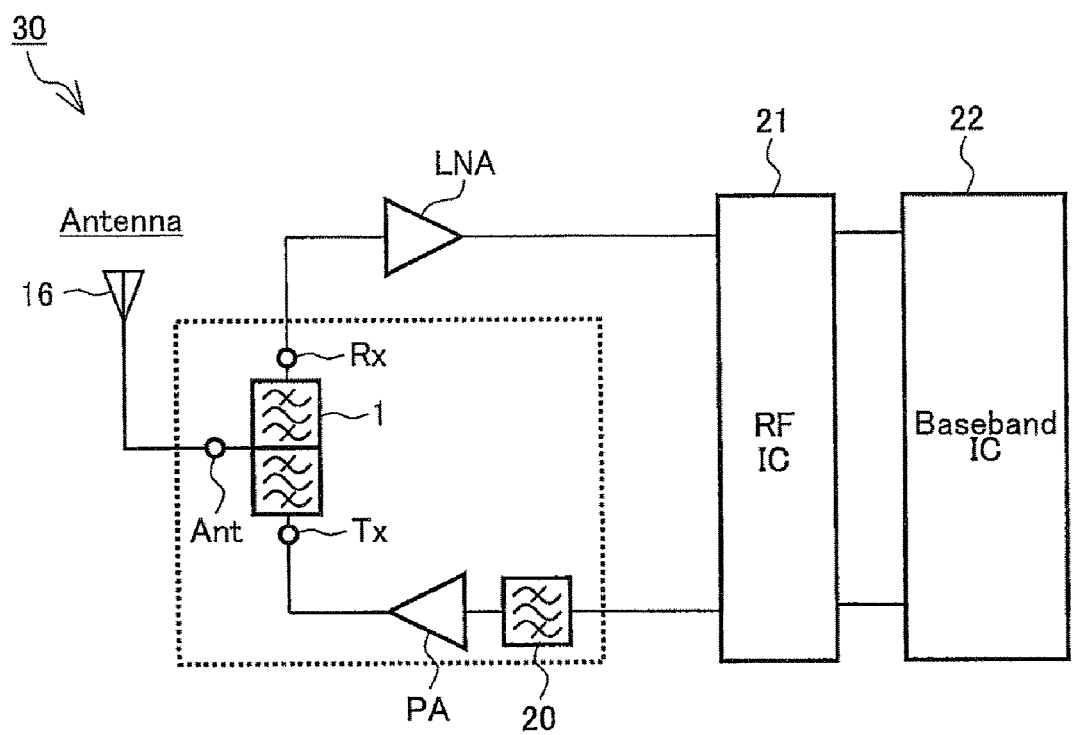
FIG. 17 is a diagram illustrating the overall configuration of a communication device 30 including the duplexer.

FIG. 17 is a diagram illustrating the overall configuration of a communication device 30 including the above-described duplexer 1. In the communication device 30 illustrated in FIG. 17, an antenna 16 is connected to a common terminal Ant of the duplexer 1. The receiving terminal Rx of the duplexer 1 is connected via a low-noise amplifier LNA to an RFIC 21. It should be note that in FIG. 17, for illustrative reasons, the receiving terminals Rx1 and Rx2 are represented by a single receiving terminal Rx. That is to say, a differential signal is output from the receiving signal Rx. Moreover, the transmitting terminal Tx of the duplexer 1 is connected via a power amplifier PA and a Tx filter 20 to the RFIC 21. The RFIC 21 is connected to a base band IC 22.

The reception signal that is received with the antenna 16 is input from the common terminal Ant into the duplexer 1, and is output as differential output (balanced output) from the receiving terminal Rx. The reception signal is amplified by the low-noise amplifier LNA, and is input into the RFIC 21. Moreover, the transmission signal that is output from the RFIC 21 passes through the Tx filter 20, is amplified by the power amplifier PA, input into the duplexer 1, and is output to the antenna 16.

A circuit including a receiving circuit for processing the reception signal that is input into it from the receiving terminal and a transmitting circuit for processing a transmission signal to be output from the antenna are integrated into the RFIC 21. The RFIC 21 is configured by a semiconductor chip and other parts.

Moreover, also the base band IC 22 is constituted by a semiconductor chip and by other parts. A circuit for converting the reception signal received from the receiving circuit in the RFIC 21 into an audio signal or packet data, and a circuit for converting an audio signal or packet data into a transmission signal and outputting it to the transmitting circuit included in the RFIC 21 are integrated in this base band IC 22.

While not illustrated in the drawings, an output device, such as a speaker, display or the like is connected to the base band IC 22, the audio signal or packet data converted with the base band IC 22 from the reception signal is output, and can be perceived by the user of the communication device 30. Moreover, an input device of the communication device 30, such as a microphone or keys or the like, is connected to the base band IC 22, and audio or data that is input by the user can be converted into a transmission signal by the base band IC 22.

It should be noted that it is also possible to form the duplexer 1, the power amplifier PA, and the Tx filter illustrated in FIG. 17 on one substrate or in one package, and produce and sell them as a transmitter module 19. It is furthermore also possible to produce and sell the duplexer 1, the power amplifier PA, the Tx filter 20, the low-noise amplifier LNA and the RFIC 21 as one module. Also modules of various other configurations including the duplexer 1 are encompassed by the embodiments of the present invention.

Thus, in the communication device 30 illustrated in FIG. 17, a duplexer 1 is used that has superior isolation properties, so that a reception signal (differential signal) of high quality and with noise suppressed is attained, even without adding parts such as a balanced output filter on the side of the receiving terminal Rx. Therefore, it is possible to realize a high-frequency module and communication device that has little non-linearity, is very compact and has high performance. Moreover, a similar effect is also attained when using a module and a communication device including one of the above-described duplexers other than the duplexer 1.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

The invention claimed is:

1. A duplexer, comprising:
a receiving filter or receiving filters that let(s) a reception signal in a receiving band pass;
a transmission signal terminal into which a transmission signal in a transmitting band that is different from the receiving band can be input;
a common terminal with which input of the reception signal in the receiving band and output of the transmission signal in the transmitting band can be performed;
a hybrid that has a plurality of first terminals and a plurality of second terminals, and that splits a signal that is input from one of the first terminals with a phase difference and outputs the split signals to the second terminals;
wherein the common terminal and the transmission signal terminal are respectively connected to the first terminals;
wherein the receiving filter(s) is/are connected to the second terminals;
wherein the hybrid outputs split signals that is input from one of the first terminals and is split with a phase difference of 90° to the second terminals, and
wherein the duplexer further comprises a phase shifter that shifts the phase of at least one of the reception signals that is input from the common terminal to the hybrid and is output with a phase difference of 90° from the second terminals, setting said phase difference to 180°.

2. The duplexer according to claim 1,
wherein the hybrid is constituted by integrated passive devices; and
these integrated passive devices, the receiving filter(s) and a transmitting filter are mounted on the same substrate.

3. A module comprising the duplexer according to claim 1.

4. A communication device comprising the duplexer according to claim 1.

* * * * *